US010266952B2

United States Patent
Kanou et al.

(10) Patent No.: US 10,266,952 B2
(45) Date of Patent: Apr. 23, 2019

(54) COPPER CHLORIDE, CVD RAW MATERIAL, COPPER WIRING FILM, AND METHOD FOR PRODUCING COPPER CHLORIDE

(71) Applicant: JX NIPPON MINING & METALS CORPORATION, Tokyo (JP)

(72) Inventors: Gaku Kanou, Ibaraki (JP); Tatsuya Omori, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 198 days.

(21) Appl. No.: 15/316,000

(22) PCT Filed: Apr. 9, 2015

(86) PCT No.: PCT/JP2015/061167
§ 371 (c)(1),
(2) Date: Dec. 2, 2016

(87) PCT Pub. No.: WO2015/186430
PCT Pub. Date: Dec. 10, 2015

(65) Prior Publication Data
US 2017/0101718 A1   Apr. 13, 2017

(30) Foreign Application Priority Data

Jun. 5, 2014  (JP) ................. 2014-116944

(51) Int. Cl.
| | | |
|---|---|---|
| *C25B 1/26* | (2006.01) | |
| *C01G 3/05* | (2006.01) | |
| *C23C 16/08* | (2006.01) | |
| *C25B 9/10* | (2006.01) | |

(Continued)

(52) U.S. Cl.
CPC ............ *C25B 1/26* (2013.01); *C01G 3/05* (2013.01); *C23C 16/08* (2013.01); *C25B 9/10* (2013.01);

(Continued)

(58) Field of Classification Search
USPC .......................................... 205/507
See application file for complete search history.

(56) References Cited

U.S. PATENT DOCUMENTS 1,602,595 A * 10/1926 Sheppard ............... C01G 5/00
                                                        204/235
1,964,569 A *  6/1934 Gernes ................... C01G 3/05
                                                         23/299

(Continued)

FOREIGN PATENT DOCUMENTS

| JP | 58-2217 A | 1/1983 | |
| JP | S62-030614 A * | 2/1987 | ............... C01G 3/05 |

(Continued)

OTHER PUBLICATIONS

Braun et al, Electrodissolution Kinetics of Copper in Acidic Chloride Solutions, Journal of the Electrochemical Society, vol. 126, No. 10, Oct. 1979, pp. 1666-1671 (Year: 1979).*

(Continued)

*Primary Examiner* — Harry D Wilkins, III
(74) *Attorney, Agent, or Firm* — Drinker Biddle & Reath LLP

(57) ABSTRACT

Provided are: copper chloride which can provide an organometallic complex that contains impurities at a small content and therefore has high purity; a CVD raw material; a copper wiring film; and a method for producing copper chloride. Copper chloride which has purity of 6 N or more and has an Ag content of 0.5 wtppm or less.

2 Claims, 1 Drawing Sheet

(51) Int. Cl.
*C25B 13/02* (2006.01)
*H01L 21/285* (2006.01)

(52) U.S. Cl.
CPC ........ *C25B 13/02* (2013.01); *H01L 21/28556* (2013.01); *C01P 2006/80* (2013.01)

(56) References Cited

U.S. PATENT DOCUMENTS

| | | | | |
|---|---|---|---|---|
| 2,046,937 | A * | 7/1936 | Curtin | C01G 3/02 423/491 |
| 2,552,753 | A * | 5/1951 | Von Schulthess | C22C 9/00 204/263 |
| 4,378,245 | A | 3/1983 | Dobson | |
| 4,409,198 | A * | 10/1983 | Coenen | C01G 3/05 423/462 |
| 4,582,579 | A * | 4/1986 | Pastor | C01G 3/05 204/277 |
| 2002/0013487 | A1* | 1/2002 | Norman | C07F 1/005 556/7 |
| 2009/0078580 | A1 | 3/2009 | Yoshihama et al. | |
| 2011/0123389 | A1* | 5/2011 | Shindo | C22C 9/00 420/499 |
| 2013/0302205 | A1 | 11/2013 | Shindo et al. | |

FOREIGN PATENT DOCUMENTS

| | | |
|---|---|---|
| JP | 2000219968 A | 8/2000 |
| JP | 2004059544 A | 2/2004 |
| JP | 2012212899 A | 11/2012 |
| KR | 1020100108457 A | 10/2010 |

OTHER PUBLICATIONS

Cooper et al, Convection and Film Instability: Copper Anodes in Hydrochloric Acid, Journal of the Electrochemical Society, vol. 105, No. 3, Mar. 1958, pp. 109-116 (Year: 1958).*

Leckie, H. P., The Anodic Polarization Behavior of Copper, Journal of the Electrochemical Society, vol. 117, No. 12, Dec. 1970, pp. 1478-1483 (Year: 1970).*

Nicol, Michael, Kinetics of the oxidation of copper (I) by hydrogen peroxide in acidic chloride solutions, South African Journal of Chemistry, vol. 35, No. 3, Jan. 1982, pp. 77-79 (Year: 1982).*

Stephenson et al, Anodic Behavior of Copper in HCl, Journal of the Electrochemical Society, vol. 101, No. 11, Nov. 1954, pp. 571-581 (Year: 1954).*

Vazquez-Arenas et al, Electrochemical study of binary and ternary copper complexes in ammonia-chloride medium, Electrochemica Acta, vol. 52, No. 20, Jun. 2007, pp. 6106-6117 (Year: 2007).*

Wang et al, Critical evaluation of thermodynamics of complex formation of metal ions in aqueous solutions III. The system Cu(I, II)—Cl—at 298.15 K, Hydrometallurgy, vol. 45, No. 1-2, May 1997, pp. 53-72 (Year: 1997).*

Cooper et al, Anodic Transients of Copper in Hydrochloric Acid, Journal of the Electrochemical Society, vol. 103, No. 6, 1956 (no month), pp. 307-315 (Year: 1956).*

Kear et al, Electrochemical Corrosion of Unalloyed Copper in Chloride Media—A Critical Review, Corrosion Science, vol. 46, No. 1, Jan. 2004, pp. 109-135 (Year: 2004).*

Lal et al, The Anodic Behaviour of Copper in Neutral and Alkaline Chloride Solutions, Journal of the Chemical Society, Issue 0, 1953 (no month), pp. 2638-2644 (Year: 1953).*

Isshiki, Minoru, "Kojundo Kinzoku no Kagakuteki Seiseiho", Kinzoku, 72(8):753-757 (Aug. 1, 2002).

Kekesi, T., et al., "Preparation of Ultra-High-Purity Copper by Anion Exchange", Metallurgical and Materials Transactions B, 28(6):987-993 (Dec. 1997).

English translation of the International Search Report of International Application No. PCT/JP2015/061167, filed Apr. 9, 2015.

English translation of the Office Action dated Aug. 11, 2015 of JP Application No. 2015-528480.

English translation of the Int'l Preliminary Report on Patentability and Written Opinion dated Dec. 6, 2016 in PCT/JP2015/061167.

* cited by examiner

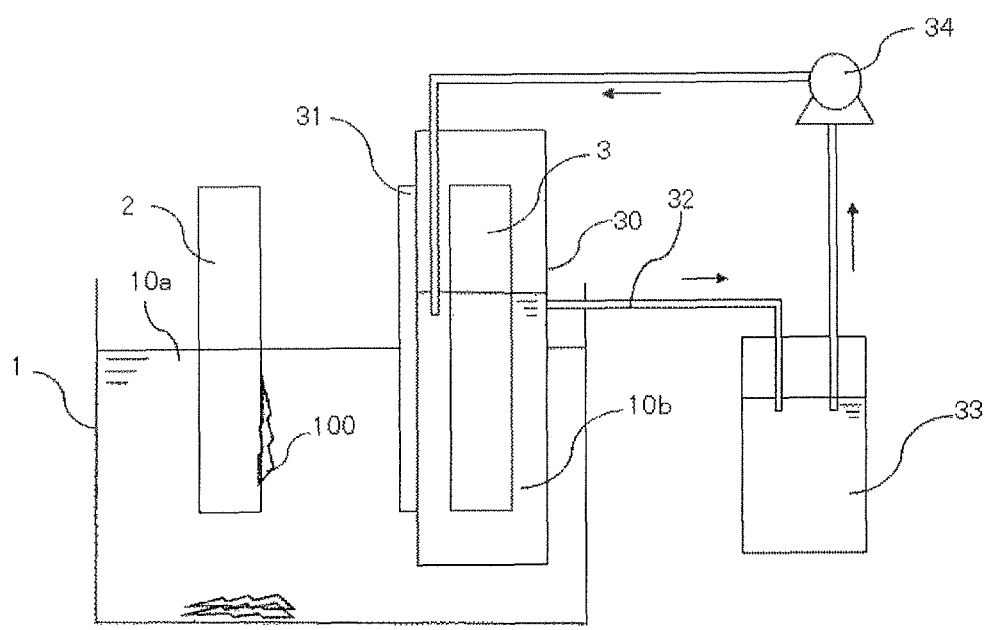

COPPER CHLORIDE, CVD RAW MATERIAL, COPPER WIRING FILM, AND METHOD FOR PRODUCING COPPER CHLORIDE

TECHNICAL FIELD

The present invention relates to copper chloride, and a CVD raw material using the same, a copper wiring film, and a method for producing copper chloride, and more particularly to copper chloride suitable for a copper raw material of a metal complex material which can be employed as a CVD or ALD raw material, a CVD raw material, a copper wiring film, and a method for producing copper chloride.

BACKGROUND ART

There has been employed a Cu wiring process using copper (Cu) as a wiring material of semiconductor devices. As an example of the Cu wiring process, a diffusion prevention film (barrier metal) is formed on a surface of wiring grooves formed in an insulating film by physical vapor deposition (PVD) such as sputtering. On a surface of barrier metal, a Cu film (Cu seed layer) is grown by sputtering or the like and a Cu film is further accumulated on this Cu film by electroplating or the like. Thereafter, the Cu film is abraded by chemical mechanical polishing (CMP) or the like until a surface of the insulating film is exposed to form a Cu wiring layer.

However, With recent requirements for densification of semiconductor integrated circuits, and miniaturization of the pitch and achievement of a high aspect ratio of wiring grooves and vias, it has become difficult for PVD that has generally been used in a conventional Cu wiring process to form a satisfactory film on the side wall of wiring groove and the depth part of the via. Therefore, a study has been made of an improvement in coatability of a Cu film by employing chemical vapor deposition (CVD) and atomic layer deposition (ALD) or the like in place of PVD.

For example, JP 2012-212899 A discloses that a barrier metal film is formed on a substrate by a sputtering method and a Cu film is formed on this barrier metal film by a CVD method. Thereafter, an annealing treatment is performed at 100 to 400° C. so as to improve adhesion between the barrier metal film and the Cu film, and also a Cu film is formed to form a Cu wiring.

There has been known, as a raw material used in a CVD process of formation of a Cu film, for example, β-ketonate-based organometallic complexes such as Cu(hfac)(tmvs) and Cu(hfac)$^2$. For example, JP 2000-219968 A discloses an example of a raw material for Cu-CVD process using Cu(hfac)(tmvs) suited for formation of a Cu film having good film quality.

CITATION LIST

Patent Literature

[Patent Literature 1]
  JP 2012-212899 A
[Patent Literature 2]
  JP 2000-219968 A

SUMMARY OF INVENTION

Technical Problem

However, according to technologies which have hitherto been proposed as a method for improving properties such as adhesion of a Cu wiring, the emphasis has been placed only on optimization of the production process itself of a Cu wiring as disclosed in Patent Literature 1, or optimization of components of an organometallic complex as a CVD raw material to be directly introduced into a CVD apparatus as disclosed in Patent Literature 2. Therefore, impurities included in copper chloride serving as a raw material in the case of producing the organometallic complex were not regarded as a serious problem, so that a study has not been made of removal or reduction of impurities from the raw material.

Meanwhile, taking further miniaturization of wiring and achievement of a high aspect ratio into consideration, it is considered that by inclusion of a large amount of impurities in the raw material for formation of an organometallic complex, there is an increase in the content of impurities in a metal film after film formation. Therefore, impurities themselves included in the raw material may also exert a large influence on various properties such as deterioration of adhesion of the metal film and deterioration of electric conductivity.

In the light of the above problems, the present invention provides copper chloride capable of providing a high-purity organometallic complex containing less impurities, a CVD raw material, a copper wiring film, and a method for producing copper chloride.

Solution to Problem

The present inventors have intensively studied so as to solve the above problems and found that it is possible to obtain high-purity copper chloride, which contains less impurities and is suitable as a raw material of an organometallic complex that is employed as a CVD or ALD raw material, by applying an electrolytic refining process of copper to the production of copper chloride, and adjusting the pH in an appropriate range in an electrochemical reaction.

The present invention completed based on the above findings provides, in an aspect, copper chloride having a purity of 6N or more and the Ag content of 0.5 wt ppm or less.

The present invention is directed to, in another aspect, copper chloride is cupric chloride having a purity of 6N or more and the Ag content of 0.05 wt ppm or less.

The copper chloride according to the present invention satisfies, in an embodiment, the following one or more conditions: (1) the content of Cr is less than 0.05 wt ppm, (2) the content of Mn is less than 0.05 wt ppm, (3) the content of Fe is less than 0.05 wt ppm, (4) the content of Co is less than 0.05 wt ppm, (5) the content of Ni is less than 0.05 wt ppm, (6) the content of As is less than 0.05 wt ppm, (7) the content of Sn is less than 0.05 wt ppm, and (8) the content of Pb is less than 0.05 wt ppm.

The copper chloride according to the present invention is directed to that, in another embodiment, in which each content of Cr, Mn, Fe, Co, Ni, As, Sn, and Pb is less than 0.05 wt ppm.

The copper chloride according to the present invention satisfies, in still another embodiment, the following one or more conditions: (9) the content of Na is less than 0.02 wt ppm, (10) the content of Mg is less than 0.02 wt ppm, (11) the content of Zn is less than 0.02 wt ppm, and (12) the content of Cd is less than 0.02 wt ppm.

The copper chloride according to the present invention is directed to that, in still another embodiment, in which each content of Na, Mg, Zn, and Cd is less than 0.02 wt ppm.

The copper chloride according to the present invention satisfies, in still another embodiment, the following one or more conditions: (13) the content of Ti is less than 0.1 wt ppm, (14) the content of In is less than 0.1 wt ppm, and (15) the content of Tl is less than 0.1 wt ppm.

The copper chloride according to the present invention is directed to that, in still another embodiment, in which each content of Ti, In, and Tl is less than 0.1 wt ppm.

The present invention is directed to, in still another aspect, copper chloride having a purity of 6N or more and the total content of one or more impurities selected from Na, Mg, Ti, Cr, Mn, Fe, Co, Ni, Zn, As, Ag, Cd, In, Sn, Tl, and Pb of 1.0 wt ppm or less.

The copper chloride according to the present invention is directed to that, in an embodiment, in which each content of Na, Mg, Ti, Cr, Mn, Fe, Co, Ni, Zn, As, Cd, In, Sn, Tl, and Pb is less than the lower detection limit measured by ICP mass spectrometry.

The present invention is directed to, in still another aspect, copper chloride having a purity of 6N or more, the content of Ag of 0.5 wt ppm or less, each content of Cr, Mn, Fe, Co, Ni, As, Sn, and Pb of less than 0.05 wt ppm, each content of Na, Mg, Zn, and Cd of less than 0.02 wt ppm, and each content of Ti, In, and Tl of less than 0.1 wt ppm.

The copper chloride according to the present invention is directed to, in still another embodiment, a hydrate or a nonhydrate of copper(I) chloride or copper(II) chloride. In the present invention, cuprous chloride composed of monovalent copper and chlorine is called copper(I) chloride, cupric chloride composed of divalent copper and chlorine is called copper(II) chloride, and when cuprous chloride and cupric chloride are not particularly limited, it is called copper chloride.

The present invention is directed to, in still another aspect, a CVD raw material produced by using the above copper chloride.

The present invention is directed to, in a still another aspect, a copper wiring film produced by using the above CVD raw material.

The copper wiring film according to the present invention is directed to that, in an embodiment, in which, when a copper wiring film having a film thickness of 10 to 200 nm is formed by a CVD method using the above copper(I) chloride according to claim 1 as CVD raw material, resistivity at 160° C. is 2.9 to $5.0 \times 10^{-6}$ Ωcm at a film thickness of 10 nm or more and less than 40 nm, 2.5 to $2.9 \times 10^{-6}$ Ωcm at 40 nm or more and less than 70 nm, and 1.7 to $2.5 \times 10^{-6}$ Ωcm at 70 nm or more and 200 nm or less.

The present invention is directed to, in a still another aspect, a method for producing a copper chloride cathode, which includes providing a partition wall between a cathode and an anode, performing an electrochemical reaction in a hydrochloric acid-based electrolytic solution using pure copper having a purity of 6N or more as an raw material anode, and taking out a chloride precipitated on a surface of the anode, followed by washing with water and further drying to produce copper chloride having a purity of 6N or more and the Ag content of 0.5 wt ppm or less.

The present invention is directed to, in still another aspect, a method for producing a copper chloride cathode, which includes providing a partition wall between a cathode and an anode, performing an electrochemical reaction in a hydrochloric acid-based electrolytic solution using pure copper having a purity of 6N or more as raw material anode, and taking out a chloride precipitated on a surface of the anode, followed by washing with water and further drying to produce copper chloride having a purity of 6N or more and total content of one or more impurities selected from Na, Mg, Ti, Cr, Mn, Fe, Co, Ni, Zn, As, Ag, Cd, In, Sn, Tl, and Pb of 1.0 wt ppm or less.

The method for producing copper chloride according to the present invention includes, in another embodiment, adjusting the pH of an electrolytic solution in a range of 1 to 3 in the electrochemical reaction to produce copper(I) chloride.

The method for producing copper chloride according to the present invention includes, in still another embodiment, adjusting the pH of an electrolytic solution in a range of to 10 in the electrochemical reaction to produce copper(II) chloride.

The method for producing copper chloride according to the present invention includes, in still another embodiment, dissolving copper(I) chloride produced by the electrochemical reaction with an acid in the presence of an oxidizing agent, followed by heating and evaporation to dryness to produce copper(II) chloride.

In the method for producing copper chloride according to the present invention, in still another embodiment, copper(I) chloride prepared by the electrochemical reaction is dissolved in a solution composed of hydrochloric acid, and any one or more oxidizing agents of hydrogen peroxide ($H_2O_2$) or hypochlorous acid ($HClO$), chlorous acid ($HClO_2$), chloric acid ($HClO_3$), and perchloric acid ($HClO_4$) to give a copper chloride solution, which is then evaporated to dryness by heating at 200 to 300° C. in vacuum, or in inert gas atmosphere, or in the atmosphere, or in a chlorine gas atmosphere to produce copper(II) chloride. Here, the inert gas is preferably a nitrogen gas or an argon gas.

Advantageous Effects of Invention

According to the present invention, it is possible to provide copper chloride capable of providing a high-purity organometallic complex containing less impurities, a CVD raw material, a copper wiring film, and a method for producing copper chloride.

BRIEF DESCRIPTION OF DRAWINGS

FIG. 1 shows an example of an apparatus capable of performing an electrochemical reaction according to the embodiment of the present invention.

DESCRIPTION OF EMBODIMENTS

Embodiments of the present invention will be described below. When a high-purity copper chloride due to an electrochemical reaction according to the embodiment of the present invention is produced by applying an electrolytic refining process of copper, there is a need to particularly consider a problem of mixing of impurities caused by the production process and an influence of impurities contained in a raw material anode to be used. In a method for producing copper chloride according to the present embodiment, it is desired to reduce these influences as much as possible.

When the high-purity copper chloride is produced, high-purity copper having a purity of 6N or more is used as a copper anode which is a raw material. For example, the copper anode can be obtained by an electrolytic refining method in which a partition wall is provided between an anode and a cathode as disclosed in JP 4620185 B1 to thereby partition the space, and an electrolytic solution containing copper ions dissolved therein is passed through an activated carbon filter to remove impurities, leading to electrodeposition on a cathode plate. Whereby, it is possible to reduce an influence of impurities contained in a raw material. When pure copper having a purity of 5N or less is used as a starting material, electrodeposited copper having a purity of 6N or more is produced by a known copper purification process and a material obtained by pickling the electrodeposited copper is preferably used as a stripping sheet raw material for the production of copper chloride according to the present invention.

As shown in FIG. 1, a high-purity copper plate having a purity of 6N or more is immersed as an anode 2 and a cathode 3 in an electrolytic bath 1, and a cathode box 30 surrounding the cathode is disposed around the cathode 3. A dilute hydrochloric acid-based electrolytic solution is used as an electrolytic solution 10a, 10b so as to generate a chloride. An anion exchange membrane (diaphragm) 31 is affixed on a surface opposing an anode plate 2 of the cathode box 30 so as to prevent 6N—Cu eluted from the anode 2 from electrodepositing on the cathode 3, thus enabling precipitation of copper chloride 100 on the anode 2. The electrolytic solution 10b at the cathode 3 is discharged to a kasolite bath 33 through a circulation line 32. The electrolytic solution in the kasolite bath 33 is supplied into the cathode box 30 via a circulation pump 34.

To eliminate elution of an organic substance through a piping for supplying an electrolytic solution or the like, or impurities contained in an electrolyzer's environment, a circulation line 32 of an electrolytic solution 10b at the cathode 3 side of an electrolytic solution supply line (not shown in the FIGURE) is preferably provided with a filter (not shown in the FIGURE) such as activated carbon is provided to thereby remove impurities in the electrolytic solution.

Due to the electrochemical reaction, a precipitate composed of a nonhydrate or a hydrate of copper chloride precipitated on the anode is dropped in the electrolytic solution by vibration of the anode. The precipitate thus dropped is washed with water and then dried, thus making it possible to produce copper chloride according to the present invention. The thus obtained copper chloride is a nonhydrate or a hydrate of cuprous chloride (copper(I) chloride) or cupric chloride (copper(II) chloride).

Adjustment of the pH of the electrolytic solution enables control of a valence of copper chloride precipitated on the anode. For example, if there is a need to precipitate copper(I) chloride on the anode, the pH of the electrolytic solution in an electrolytic bath is preferably adjusted in a range of 1.0 to 3.0, and more preferably 1.0 to 2.0. Whereby, a white crystal (CuCl) as cuprous chloride is precipitated on a surface of the anode. If the pH is adjusted to lower than 1.0, solubility of copper increases to cause a problem that it becomes difficult to precipitate copper(I) chloride. If the pH is adjusted to higher than 3.0, copper(II) chloride is partially formed in the precipitate of copper(I) chloride to cause a problem that it becomes difficult to separately forming copper chloride of cuprous chloride and cupric chloride.

If there is a need to form cupric chloride (copper(II) chloride) on the anode, the pH of the electrolytic solution in the electrolytic bath is adjusted in a range of 9 to 10 by supplying ammonia to the electrolytic solution or the like. Whereby, copper is eluted from the anode on a surface of the anode in anolyte, and divalent copper ions are combined with hydroxide ions to form $Cu(OH)_2$. As a result of substitution with chlorine which is a main component of the electrolytic solution, a solution of copper(II) chloride is prepared. The copper(II) chloride solution thus obtained is filtered and the filter cake is washed and then dried to obtain a powder. Here, if there is a need to adjust the pH to lower than 9, copper(I) chloride is partially formed in the solution of copper(II) chloride to cause a problem that it becomes difficult to separately forming cuprous chloride and cupric chloride. If the pH is adjusted to higher than 10, the concentration of ammonia increases and a copper ammonia complex ($[Cu(NH_3)_4](OH)_2$) is likely to be formed, leading to difficulty in separation from ammonia. Increase in the amount used may lead to unfavorable situations such as increase in production cost, deterioration of the environment at a working site due to odor of ammonia, and the like. When using an alkali solution composed of hydroxide ions, a problem such as contamination of copper(II) chloride with a base component of cation component in a hydroxide, leading to unfavorable situation. The liquid temperature of the electrolytic solution is preferably in a range of 10 to 50° C., and more preferably 20 to 30° C.

The copper chloride produced by the above-mentioned production method is copper chloride which has a purity of 6N or more and also includes one or more selected from the group consisting of Na, Mg, Ti, Cr, Mn, Fe, Co, Ni, Zn, As, Ag, Cd, In, Sn, Tl, and Pb as impurities, wherein the total content (concentration) of impurities is 1.0 wt ppm or less, preferably 0.85 wt ppm or less, and more preferably 0.5 wt ppm or less (concentration).

Each content of Na, Mg, Ti, Cr, Mn, Fe, Co, Ni, Zn, As, Ag, Cd, In, Sn, Tl, and Pb is analyzed by ICP mass spectrometry (inductively coupled plasma-mass spectrometry (ICP-MS)).

In the copper chloride according to the present embodiment, each content of Na, Mg, Ti, Cr, Mn, Fe, Co, Ni, Zn, As, Cd, In, Sn, Tl, and Pb is 0.1 wt ppm or less, and preferably 0.05 wt ppm or less.

In the copper chloride produced by the above-mentioned production method, each content of Na, Mg, Ti, Cr, Mn, Fe, Co, Ni, Zn, As, Cd, In, Sn, Tl, and Pb is less than the lower detection limit measured by ICP mass spectrometry. "Lower detection limit" in the present invention means that the content of Na is less than 0.02 wt ppm, the content of Mg is less than 0.02 wt ppm, the content of Ti is less than 0.1 wt ppm, the content of Cr is less than 0.05 wt ppm, the content of Fe is less than 0.05 wt ppm, the content of Co is less than 0.05 wt ppm, the content of Ni is less than 0.05 wt ppm, the content of Zn is less than 0.02 wt ppm, the content of As is less than 0.05 wt ppm, the content of Cd is less than 0.02 wt ppm, the content of In is less than 0.1 wt ppm, the content of Sn is less than 0.05 wt ppm, the content of Tl is less than 0.1 wt ppm, and the content of Pb is less than 0.05 wt ppm.

In the copper chloride according to the present embodiment, the content of Ag is 0.5 wt ppm or less, and more preferably 0.05 wt ppm or less. Each content of Cr, Mn, Fe, Co, Ni, As, Sn, and Pb is less than 0.05 wt ppm. Each content of Na, Mg, Zn, and Cd is less than 0.02 wt ppm. Each content of Ti, In, and Tl is less than 0.1 wt ppm.

According to the present invention, a copper chloride crystal containing less concentration of impurities is easily obtained. Using this copper chloride crystal as a raw material of an organometallic complex which is employed as a CVD raw material or an ALD raw material, a Cu film (Cu seed film) is formed by CVD or ALD employing this organometallic complex, thus making it possible to form a Cu wiring which exhibits low concentration of impurities, high adhesion with a barrier film, and small variation in resistivity.

Purity of 6N (99.9999%) of the copper chloride in the present invention means the concentration which is determined by analyzing main impurities such as Na, Mg, Ti, Cr, Mn, Fe, Co, Ni, Zn, As, Ag, Cd, In, Sn, Tl, and Pb, while adjusting the concentration of copper chloride composed of chlorine and copper as a matrix to 1, using an ICP-MS method, followed by subtraction of the total value of the thus detected concentration of impurities concentration. It has already been confirmed that the copper anode having a purity of 6N after the above-mentioned partition wall electrolysis, used as the raw material of the present invention, is a high-purity copper anode having a purity of 6N or more, which contains, as main impurities, a trace amount (0.5 wt ppm or less) of Ag (see, for example, Table 1 of JP 4519775 B1) excluding gas component elements (carbon, oxygen, and phosphorus), and also the copper chloride produced by the present invention has the Ag content of 0.5 wt ppm or less and a purity of 6N or more.

The copper wiring film, which is obtained by fabricating a precursor composed of amidinate-based copper from the copper(I) chloride obtained by the above-mentioned electrochemical reaction, and forming a film by an MOCVD method using this precursor as a CVD raw material, exhibits satisfactory properties, and resistivity at 160° C. of a wiring film having a film thickness of 10 to 100 nm is about 1.7 to $5.0 \times 10^{-6}$ Ωcm (1.7 to $5 \times 10^{-8}$ Ωm). For example, when a copper wiring film according to the present embodiment is formed from the above-mentioned copper(I) chloride, the resistivity at 160° C. is in a range of 2.9 to $5.0 \times 10^{-6}$ Ωcm at the film thickness of 10 nm or more and less than 40 nm, 2.5 to $2.9 \times 10^{-6}$ Ωcm at 40 nm or more and less than 70 nm, or 1.7 to $2.5 \times 10^{-6}$ Ωcm at 70 nm or more and 200 nm or less. Meanwhile, when using a precursor composed of amidinate-based copper produced using commercially available copper chloride, the resistivity is in a range of about 5.5 to $8.5 \times 10^{-6}$ Ωcm at a film thickness of 10 to 40 nm. Thus, even if the copper wiring film has a small film thickness, the resistivity can be minimized.

The copper(II) chloride can be produced by heating the copper(I) chloride produced by the above-mentioned electrochemical reaction (electrolytic synthesis method).

In this case, the copper(I) chloride produced by the electrochemical reaction is dissolved in a solution composed of hydrochloric acid, and any one or more oxidizing agents of hydrogen peroxide ($H_2O_2$) or hypochlorous acid (HClO), chlorous acid ($HClO_2$), chloric acid ($HClO_3$), and perchloric acid ($HClO_4$) to give a copper chloride solution, which is then evaporated to dryness by heating at 200 to 300° C. in vacuum, or in inert gas atmosphere, or in the atmosphere, or in a chlorine gas atmosphere, thus making it possible to produce copper(II) chloride. Here, more preferably, the copper(I) chloride is dissolved in a solution composed of hydrochloric acid and hydrogen peroxide water to give a copper chloride solution, which is then evaporated to dryness by heating at 200 to 300° C. in vacuum or a chlorine gas atmosphere to produce copper(II) chloride, thus making it possible to satisfactorily produce copper(II) chloride without remaining the unreacted copper(I) chloride. Here, if the heat treatment temperature is lower than 200° C., too long heat treatment time may be required so as to oxidize the copper(I) chloride into the copper(II) chloride. If the heat treatment temperature is higher than 300° C., the copper(II) chloride may be decomposed, unfavorably. This heat treatment step eliminates necessity for supplying ammonia in the production of high-purity copper(II) chloride by the above-mentioned electrolytic synthesis method (pH=9 to 10), thus enabling a decrease in amount of a chemical used in the reduction, leading to the production of high-purity copper chloride at low cost. While there is a need to pay attention to a treatment of ammonia since it has risk of causing small explosion, use of the present method enhances safety in the production process.

The copper(II) chloride obtained by this heat treatment has a purity of 6N and the total amount of impurity element is 1.0 wt ppm or less, so that it is suitable as a high-purity CVD raw material or an ALD raw material. Furthermore, when a precursor composed of amidinate-based copper is produced using this high-purity CVD raw material or ALD raw material, and a wiring film (Cu film) is formed using this precursor, adhesion is improved as compared with the case where a conventional hexafluoro-copper is used as a precursor, and also an influence of an increase in wiring resistivity due to mixing of impurities is reduced.

EXAMPLES

Examples of the present invention will be described below, but the present invention is not limited to the following Examples.

Example 1

Using an apparatus shown in FIG. 1, an electrochemical reaction was performed by a dilute hydrochloric acid-based electrolytic solution, employing 6N—Cu as raw material anode and cathode. A peripheral surface of a cathode is covered with a cathode box and an anion exchange membrane (diaphragm) was affixed on a surface opposing an anode of the cathode box so as to prevent 6N—Cu eluted from the anode from electrodepositing on the cathode, thus enabling precipitation of copper chloride on the anode. While adjusting the pH of the electrolytic solution to 1.5, the electrochemical reaction was performed at an electrolytic liquid temperature of 25° C. At this time, the pH of the electrolytic solution in an electrolytic bath becomes almost uniform in the electrolytic bath. The pH value was monitored by the electrolytic solution (anolyte) at the anode side, and the precipitate formed on a surface of the anode was dropped in the electrolytic solution by vibrating the anode. The precipitate thus dropped was taken out, washed with water and then dried to obtain a powder of copper(I) chloride. The thus obtained copper(I) chloride in the powder had a purity of 99.9999 mass %. Furthermore, the content of impurities in the thus obtained copper(I) chloride was analyzed by using an ICP mass spectrometry (ICP-MS) method. The analysis results of impurities (unit is entirely expressed as "weight (wt) ppm") are shown in Table 1. In Table 1, sign of inequality "<" means the lower detection limit of the ICP-MS method, and also has the same meaning in Tables 2 and 3 of the present specification.

TABLE 1

| Na | Mg | Ti | Cr | Mn | Fe | Co | Ni | Zn |
|---|---|---|---|---|---|---|---|---|
| <0.02 | <0.02 | <0.1 | <0.05 | <0.05 | <0.05 | <0.05 | <0.05 | <0.02 |

| As | Ag | Cd | In | Sn | Tl | Pb | Total amount of impurities |
|---|---|---|---|---|---|---|---|
| <0.05 | 0.39 | <0.02 | <0.1 | <0.05 | <0.1 | <0.05 | 0.39 |

As shown in Table 1, all elements exhibit the lower detection limit, except that 0.39 ppm of silver was measured as impurity in a crystal of copper(I) chloride obtained in Example 1, and it is apparent that high-purity copper chloride containing less impurities is obtained.

Example 2

An electrochemical reaction was performed by a dilute hydrochloric acid-based electrolytic solution, employing 6N—Cu as raw material anode and cathode. A peripheral surface of a cathode is covered with a cathode box and an anion exchange membrane (diaphragm) was affixed on a surface opposing an anode of the cathode box so as to prevent 6N—Cu eluted from the anode from electrodepositing on the cathode, thus enabling precipitation of copper chloride on the anode. While adjusting the pH of the electrolytic solution to 9, the electrochemical reaction was performed at an electrolytic liquid temperature of 25° C. At this time, the pH of the electrolytic solution in an electrolytic bath becomes almost uniform in the electrolytic bath. The pH value was monitored by the electrolytic solution (anolyte) at the anode side and the electrolytic solution containing copper(II) chloride precipitated on a surface of the anode by the electrochemical reaction was taken out, washed and then dried to obtain a powder of copper(II) chloride. The thus obtained copper(II) chloride in the powder had a purity of 99.9999 mass %. Furthermore, the content of impurities in the thus obtained powder was analyzed by using an ICP mass spectrometer. The analysis results of impurities (unit is entirely expressed as "weight (wt) ppm") are shown in Table 2.

TABLE 2

| Na | Mg | Ti | Cr | Mn | Fe | Co | Ni | Zn |
|---|---|---|---|---|---|---|---|---|
| <0.02 | <0.02 | <0.1 | <0.05 | <0.05 | <0.05 | <0.05 | <0.05 | <0.02 |

| As | Ag | Cd | In | Sn | Tl | Pb | Total amount of impurities |
|---|---|---|---|---|---|---|---|
| <0.05 | 0.04 | <0.02 | <0.1 | <0.05 | <0.1 | <0.05 | 0.04 |

As shown in Table 2, all elements exhibit the lower detection limit, except that 0.04 wt ppm of silver was measured as impurity in a crystal of copper(II) chloride obtained in Example 2, and it is apparent that high-purity copper chloride containing less impurities is obtained.

Example 3

In the same manner as in Example 1, except that copper(I) chloride dropped in an electrolytic solution was taken out and then dissolved in a solution composed of hydrochloric acid and hydrogen peroxide water to give a copper chloride solution, which was heated at 250° C. in vacuum (10.1 kPa=0.1 atm) and evaporated to dryness, a heat-treated product was obtained. As a result of valence analysis of this heat-treated product by an XRD method, it has been found that copper(II) chloride is obtained. The content of impurities in the thus obtained powder was analyzed by using an ICP mass spectrometer. The results are shown in Table 3.

TABLE 3

| Na | Mg | Ti | Cr | Mn | Fe | Co | Ni | Zn |
|---|---|---|---|---|---|---|---|---|
| <0.02 | <0.02 | <0.1 | <0.05 | <0.05 | <0.05 | <0.05 | <0.05 | <0.02 |

| As | Ag | Cd | In | Sn | Tl | Pb | Total amount of impurities |
|---|---|---|---|---|---|---|---|
| <0.05 | 0.39 | <0.02 | <0.1 | <0.05 | <0.1 | <0.05 | 0.39 |

As shown in Table 3, the copper(II) chloride obtained in Example 3 had a purity of 6N or more, and the total concentration of impurities was 1.0 wt ppm or less.

Example 4

In the same manner as in Example 1, except that copper(I) chloride dropped in an electrolytic solution was taken out and then dissolved in a solution composed of hydrochloric acid and hypochlorous acid (HClO) to give a copper chloride solution, which was heated at 300° C. in a chlorine gas atmosphere (using, as a balance gas, a chlorine gas containing 98% of nitrogen and 2% of $Cl_2$) and evaporated to dryness, a heat-treated product was obtained. Valence analysis of the heat-treated product was performed by ab XRD method. As a result, like Example 3, it could be confirmed that copper(I) chloride is satisfactorily converted into copper (II) chloride by the present method. The content of impurities in the thus obtained powder was comparable with that of Example 3 and the content of Ag detected was 0.38 wt ppm. Each content of other elements was less than the lower detection limit and the purity was 6N or more.

Example 5

Using the monovalent copper chloride obtained in Example 1, an amidinate-based precursor was produced as a CVD raw material. Regarding the case where a Cu film was formed on an Si substrate using the thus obtained CVD raw material and a hydrogen gas was supplied into a chamber, and the case where a mixed gas of a hydrogen gas and an argon gas was supplied, surface property of the thus obtained Cu thin film was evaluated. A square-shaped Si substrate having a length of 50 mm and a width of 50 mm was disposed in a reaction chamber as a Si substrate, and then the temperature of the center of the Si substrate was measured by a temperature sensor. The results are shown in Table 4.

TABLE 4

| Condition | Carrier gas (sccm) | Precursor temperature (° C.) | Substrate temperature (° C.) | Cu film property |
|---|---|---|---|---|
| 1 | $H_2$ 100 | 120 | 350 | Decomposition occurred in bottle |
| 2 | Ar 100 $H_2$ 100 Intermittent supply | 120 | 200 | Low accumuration rate |
| 3 | Ar 100 $H_2$ 100 | 120 | 200 | Satisfactory |
| 4 | Ar 100 $H_2$ 100 | 120 | 350 | Ununiformity of film thickness occurred |

Example 6, and Comparative Example

Table 5 shows, as Example 6, a relationship between the film thickness and the resistivity of the CVD film obtained under the condition 3 in Example 5, and shows, as Comparative Example 1, a comparison between the film thickness and the resistivity of copper wiring film obtained by using commercially available amidinate-based precursor (copper chloride purity of 4N). The resistivity of the copper wiring film of Example 5 is $(1.7 \text{ to } 5.0) \times 10^{-8}$ Ωm when a film thickness of a copper wiring is in a range of 10 to 200 nm at 160° C., thus achieving the resistivity lower than that of the copper wiring film obtained by using commercially available amidinate-based precursor (copper chloride purity of 4N) of Comparative Example 1. The resistivity at 16° C. of the copper wiring film obtained in Example 5 is shown as that in Reference Example 1, and also the resistivity at 16° C. of the copper wiring film obtained by using commercially available amidinate-based precursor (copper chloride purity of 4N) is shown as that in Reference Example 2. It is apparent that the resistivity lower than that of Conventional Example can also be realized at 16° C., and the resistivity is also minimized at 160° C. as compared with Conventional Example.

TABLE 5

| (Copper film thickness and resistivity at 16° C.) Reference Example 1 (6N) | | (Copper film thickness and resistivity at 160° C.) Example 5 (6N) | | (Copper film thickness and resistivity at 16° C.) Reference Example 2 (4N) | | (Copper film thickness and resistivity at 160° C.) Comparative Example 1 (4N) | |
|---|---|---|---|---|---|---|---|
| Copper film thickness (nm) | Resistivity ($10^{-6}$ Ωcm) | Copper film thickness (nm) | Resistivity ($10^{-6}$ Ωcm) | Copper film thickness (nm) | Resistivity ($10^{-6}$ Ωcm) | Copper film thickness (nm) | Resistivity ($10^{-6}$ Ωcm) |
| 10 | 7.0 | 10 | 5.0 | 10 | 13.0 | 10 | 8.2 |
| 40 | 5.2 | 40 | 2.9 | 40 | 9.4 | 40 | 5.5 |
| 70 | 4.3 | 70 | 2.5 | 70 | 6.3 | 70 | 4.1 |
| 200 | 3.2 | 200 | 1.7 | 200 | 3.2 | 200 | 2.8 |

REFERENCE SIGNS LIST

1 Electrolytic bath
2 Anode
3 Cathode
10a, 10b Electrolytic solution
30 Cathode box
31 Anion exchange membrane (diaphragm)
32 Circulation line
33 Kasolite bath
34 Circulation pump

The invention claimed is:

1. A method for producing copper chloride, which comprises
providing a partition wall between a cathode and an anode, providing a hydrochloric acid-based electrolytic solution, performing an electrochemical reaction in the hydrochloric acid-based electrolytic solution using pure copper having a purity of 6N or more as an raw material anode, adjusting the pH of the electrolytic solution in a range of 9 to 10 during the electrochemical reaction to produce copper(II) chloride, and taking out a chloride precipitated on a surface of the anode, followed by washing with water and further drying to produce copper chloride having a purity of 6N or more and the Ag content of 0.5 wt ppm or less.

2. A method for producing copper chloride, which comprises providing a partition wall between a cathode and an anode, providing a hydrochloric acid-based electrolytic solution, performing an electrochemical reaction in the hydrochloric acid-based electrolytic solution using pure copper having a purity of 6N or more as a raw material anode, adjusting the pH of the electrolytic solution in a range of 9 to 10 during the electrochemical reaction to produce copper(II) chloride, and taking out a chloride precipitated on a surface of the anode, followed by washing with water and further drying to produce copper chloride having a purity of 6N or more and a total content of one or more impurities selected from the group consisting of Na, Mg, Ti, Cr, Mn, Fe, Co, Ni, Zn, As, Ag, Cd, In, Sn, Tl, and Pb of 1.0 wt ppm or less.

* * * * *